United States Patent
Ushijima et al.

(10) Patent No.: US 12,494,396 B2
(45) Date of Patent: Dec. 9, 2025

(54) MANUFACTURING METHOD OF SEMICONDUCTOR DEVICE

(71) Applicants: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

(72) Inventors: Takashi Ushijima, Nisshin (JP); Kozo Kato, Nisshin (JP); Yoshitaka Nagasato, Nisshin (JP); Masatake Nagaya, Nisshin (JP); Shinichi Hoshi, Nisshin (JP); Daisuke Kawaguchi, Hamamatsu (JP); Keisuke Hara, Hamamatsu (JP)

(73) Assignees: DENSO CORPORATION, Kariya (JP); TOYOTA JIDOSHA KABUSHIKI KAISHA, Toyota (JP); MIRISE Technologies Corporation, Nisshin (JP); HAMAMATSU PHOTONICS K.K., Hamamatsu (JP)

(*) Notice: Subject to any disclaimer, the term of this patent is extended or adjusted under 35 U.S.C. 154(b) by 587 days.

(21) Appl. No.: 17/960,981

(22) Filed: Oct. 6, 2022

(65) Prior Publication Data
US 2023/0116208 A1 Apr. 13, 2023

(30) Foreign Application Priority Data
Oct. 11, 2021 (JP) .................................. 2021-166900

(51) Int. Cl.
*H01L 21/762* (2006.01)
*H01L 21/268* (2006.01)
(Continued)

(52) U.S. Cl.
CPC ...... *H01L 21/76232* (2013.01); *H01L 21/268* (2013.01); *H01L 21/67092* (2013.01); *H01L 21/78* (2013.01); *H01L 21/7813* (2013.01)

(58) Field of Classification Search
CPC .............. H01L 21/76232; H01L 21/78; H01L 21/7813; B23K 26/53; H10D 89/011–013
See application file for complete search history.

(56) References Cited

U.S. PATENT DOCUMENTS

2003/0232488 A1* 12/2003 Chua ................ H01L 21/76898
257/E21.597
2006/0134885 A1 6/2006 Yamazaki et al.
(Continued)

FOREIGN PATENT DOCUMENTS

CN       103972096 A  *  8/2014  .......... H10D 62/111
JP       2008-053372 A     3/2008
(Continued)

OTHER PUBLICATIONS

Machine translation of CN-103972096-A (Year: 2014).*

*Primary Examiner* — Erik T. K. Peterson
(74) *Attorney, Agent, or Firm* — Posz Law Group, PLC

(57) ABSTRACT

A method of manufacturing a semiconductor device includes a trench forming step, a laser irradiation step and a peeling step. In the trench forming step, a trench is formed on a first main surface of a semiconductor substrate having a device structure formed thereon. In the laser irradiation step, a laser is irradiated from a second main surface of the semiconductor substrate to a plane surface that is positioned and extends at a predetermined depth of the semiconductor substrate. In the peeling step, a device layer is peeled off from the semiconductor substrate along the plane surface on which the laser is irradiated. The peeling step may be performed in a state in which the trenches are either unfilled or filled with (Continued)

a material having a lower coefficient of thermal expansion than the semiconductor substrate.

11 Claims, 6 Drawing Sheets

(51) Int. Cl.
 *H01L 21/67* (2006.01)
 *H01L 21/78* (2006.01)

(56) References Cited

U.S. PATENT DOCUMENTS

| | | | | |
|---|---|---|---|---|
| 2006/0220214 | A1* | 10/2006 | Ando | H01L 23/3114 |
| | | | | 257/E23.012 |
| 2007/0148803 | A1* | 6/2007 | Yakushiji | H01L 21/0262 |
| | | | | 438/33 |
| 2009/0121337 | A1* | 5/2009 | Abe | H01L 21/268 |
| | | | | 257/E21.237 |
| 2010/0136766 | A1* | 6/2010 | Sakamoto | B23K 26/53 |
| | | | | 257/E21.599 |
| 2012/0091107 | A1* | 4/2012 | Sugiura | B23K 26/53 |
| | | | | 219/121.72 |
| 2012/0104066 | A1* | 5/2012 | Uchiyama | B23K 26/40 |
| | | | | 225/2 |
| 2012/0111495 | A1* | 5/2012 | Shimoi | H01L 21/78 |
| | | | | 29/411 |
| 2012/0135585 | A1* | 5/2012 | Shimoi | H01L 21/78 |
| | | | | 257/E21.599 |
| 2013/0240919 | A1* | 9/2013 | Park | H10H 20/819 |
| | | | | 438/460 |
| 2014/0038392 | A1* | 2/2014 | Yonehara | B81C 1/0038 |
| | | | | 438/463 |
| 2014/0117507 | A1* | 5/2014 | Juengling | H10D 30/6211 |
| | | | | 257/E21.546 |
| 2014/0206162 | A1* | 7/2014 | Eguchi | H01L 21/3081 |
| | | | | 438/268 |
| 2015/0041828 | A1* | 2/2015 | Nagao | H10D 30/665 |
| | | | | 257/77 |
| 2015/0380384 | A1* | 12/2015 | Williams | H01L 21/31058 |
| | | | | 438/112 |
| 2017/0256638 | A1* | 9/2017 | Macelwee | H01L 23/3171 |
| 2019/0362972 | A1* | 11/2019 | Schulze | H01L 21/02378 |
| 2020/0013859 | A1* | 1/2020 | Schaeffer | H01L 23/544 |
| 2020/0365462 | A1* | 11/2020 | Iwasawa | H01L 21/02002 |
| 2020/0388538 | A1* | 12/2020 | Swoboda | H01L 21/02005 |
| 2021/0053148 | A1* | 2/2021 | Rieske | H01L 21/02002 |
| 2022/0076999 | A1* | 3/2022 | Teranishi | H01L 21/6715 |

FOREIGN PATENT DOCUMENTS

| | | |
|---|---|---|
| JP | 2020-102520 A | 7/2020 |
| JP | 2020-181876 A | 11/2020 |

* cited by examiner

MANUFACTURING METHOD OF SEMICONDUCTOR DEVICE

CROSS REFERENCE TO RELATED APPLICATION

The present application is based on and claims the benefit of priority of Japanese Patent Application No. 2021-166900, filed on Oct. 11, 2021, the disclosure of which is incorporated herein by reference.

TECHNICAL FIELD

The technology disclosed in the present specification generally relates to a method for manufacturing a semiconductor device.

BACKGROUND

A technique has been developed in which a device structure is formed on one main surface of a semiconductor substrate and then a device layer with the device structure is peeled off from the semiconductor substrate. By using such a technique, it is possible to reuse the semiconductor substrate from which the device layer has been peeled off, thereby reducing the manufacturing cost of the semiconductor device.

SUMMARY

According to an aspect of a present disclosure, a method of manufacturing a semiconductor device includes a trench forming step, a laser irradiation step, and a peeling step. In the trench forming step, a plurality of trenches are formed on a first main surface of a semiconductor substrate that has a second main surface in addition to the first main surface with a device structure. In the laser irradiation step, a laser is irradiated from the second main surface to a plane surface that is positioned and extends at a predetermined depth of the semiconductor substrate. In the peeling step, a device layer is peeled off from the semiconductor substrate along the plane surface on which the laser is irradiated. The peeling step may be performed in a state in which the trenches are unfilled or filled with a material having a coefficient of thermal expansion lower than that of the semiconductor substrate.

In the manufacturing method, by forming the trench in the semiconductor substrate, a stress applied to the semiconductor substrate is relievable and the warpage of the semiconductor substrate can be reduced. Further, the trenches formed in the trench forming step are maintained in a state of being unfilled or filled with a material having a low coefficient of thermal expansion even in the peeling step. Therefore, the peeling step can be performed while warpage of the semiconductor substrate is suppressed. According to such a manufacturing method, when the device layer is peeled off from the semiconductor substrate, the peeling force is transmitted along the altered layer, thereby peeling of the device layer off from the semiconductor substrate can be appropriately performed.

BRIEF DESCRIPTION OF THE DRAWINGS

Objects, features, and advantages of the present disclosure will become more apparent from the following detailed description made with reference to the accompanying drawings, in which.

DETAILED DESCRIPTION

Figure 1:
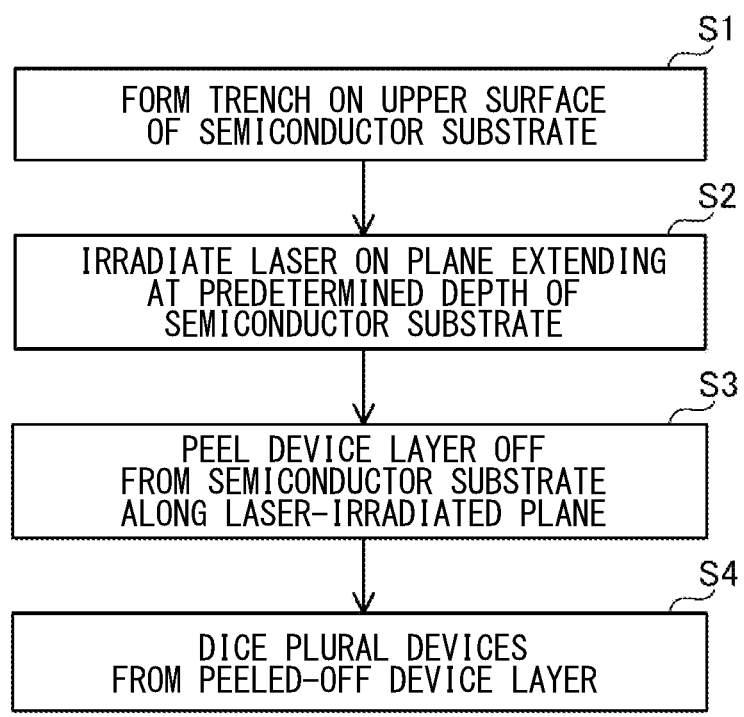
FIG. 1 is a diagram showing a flow of a trench forming step, a laser irradiation step, a peeling step, and a dicing step in a method of manufacturing a semiconductor device according to an embodiment of the present disclosure.

In a method of manufacturing a semiconductor device, an altered layer may be formed inside the semiconductor substrate by irradiating a laser to a predetermined surface of a semiconductor substrate extending at a predetermined depth thereof. Then, a device layer is peeled off from the semiconductor substrate along the predetermined surface on which the altered layer is formed.

In the method of manufacturing a semiconductor device, warpage may occur in the semiconductor substrate. If the semiconductor substrate is warped, the altered layer in the semiconductor substrate is also warped. In this case, when peeling off the device layer from the semiconductor substrate, a peeling force is less likely to be transmitted along the altered layer, and thereby it may cause peeling failure or breakage of the semiconductor substrate.

In view of the above matter, it is an object of the present disclosure to provide a technique capable of reducing warpage of a semiconductor substrate and appropriately peeling a device layer off from the semiconductor substrate.

A method of manufacturing a semiconductor device of the present disclosure may include a trench forming step, a laser irradiation step, and a peeling step. In the trench forming step, trenches are formed in a first main surface of a semiconductor substrate having the first main surface and a second main surface. The semiconductor substrate is not particularly limited, but may be a compound semiconductor. Although the semiconductor substrate is one example, it may also be a nitride semiconductor including gallium nitride, silicon carbide, or gallium oxide. Since the semiconductor substrate is reusable, the method of manufacturing a semiconductor device disclosed in the present specification is particularly useful when being applied to a semiconductor substrate of an expensive compound semiconductor. A device structure may be formed on a first main surface of the semiconductor substrate. In the laser irradiation step, a plane surface of the semiconductor substrate extending at a predetermined depth is irradiated with a laser. In the laser irradiation step, the laser is irradiated to the predetermined depth of the semiconductor substrate from the second main surface where the trench is not formed. In the peeling step, a device layer with the device structure is peeled off from the semiconductor substrate along the plane surface irradiated with the laser. The peeling step may be performed in a state in which the trench is not filled or filled with a material having a lower coefficient of thermal expansion than the semiconductor substrate.

In the trench forming step, the trenches may be formed so as to repeatedly appear along at least one direction on the first main surface when the semiconductor substrate is seen in a top view, i.e., when viewed from above of the first main surface of the semiconductor substrate. Since the trenches are formed to appear repeatedly, warpage of the semiconductor substrate in at least one direction is reduced. In such case, the trenches may be arranged at regular intervals along the at least one direction.

When the trenches are formed to appear repeatedly, a maximum pitch of the trenches measured along the at least one direction may be 0.0177 times or less of a diameter of the semiconductor substrate. Here, the trench pitch means a distance between adjacent trenches. According to such a manufacturing method, a peeling success rate can be significantly improved.

In case where the trenches are formed to appear repeatedly, in the peeling step, the device layer may be peeled off from the semiconductor substrate from one end toward the other end of the semiconductor substrate in at least one direction. Since the device layer is peeled off from the semiconductor substrate in the direction in which the warpage of the semiconductor substrate is reduced, the device layer can be peeled off appropriately from the semiconductor substrate.

A plurality of device regions partitioned by dicing lines may be provided in the device layer. In such case, each of the plurality of device regions is a region in which the device structure is formed. The trench may extend across the plurality of device regions.

The trench may include a first trench extending along a first direction and a second trench extending along a second direction orthogonal to the first direction in a top view of the semiconductor device, i.e., when the semiconductor substrate is viewed from above of the first may surface. The first trench and the second trench may be connected in a planar T-shape. According to such manufacturing method, the stress at a portion where the first trench and the second trench are connected is reduced, and damage to the semiconductor substrate is suppressible.

The semiconductor substrate may be a hexagonal crystal semiconductor. In such case, the trenches may extend like hexagons arranged without gaps when the semiconductor substrate is viewed from the above of the first may surface. According to such manufacturing method, since the trenches are formed so as to appear repeatedly along three directions when the semiconductor substrate is viewed from the above of the first may surface, warpage of the semiconductor substrate as a whole is reducible in a well-balanced manner. In addition, since an angle between the trenches at the portion where the trenches are connected becomes an obtuse angle, the stress at such portion is relievable, and the breakage of the semiconductor substrate is suppressible.

Hereinafter, a manufacturing method of a semiconductor device including a trench forming step, a laser irradiation step, a peeling step and a dicing step according to an embodiment of the present disclosure will be described with reference to the drawings. Note that various other steps other than the trench forming step, the laser irradiation step, the peeling step, and the dicing step, such as a step of forming a device structure, can be performed by utilizing known manufacturing techniques. For example, the process, i.e., steps, of forming the device structure may be performed between the trench forming step and the laser irradiation step.

FIG. 1 shows a flow of the trench forming step (step S1), the laser irradiation step (step S2), the peeling step (step S3) and the dicing step (step S4). The method of manufacturing a semiconductor device disclosed in the present specification ban manufacture a plurality of semiconductor devices, which may also be referred to as semiconductor chips, by performing these steps on a semiconductor substrate 1 shown in FIGS. 2 and 3.

Figure 2:
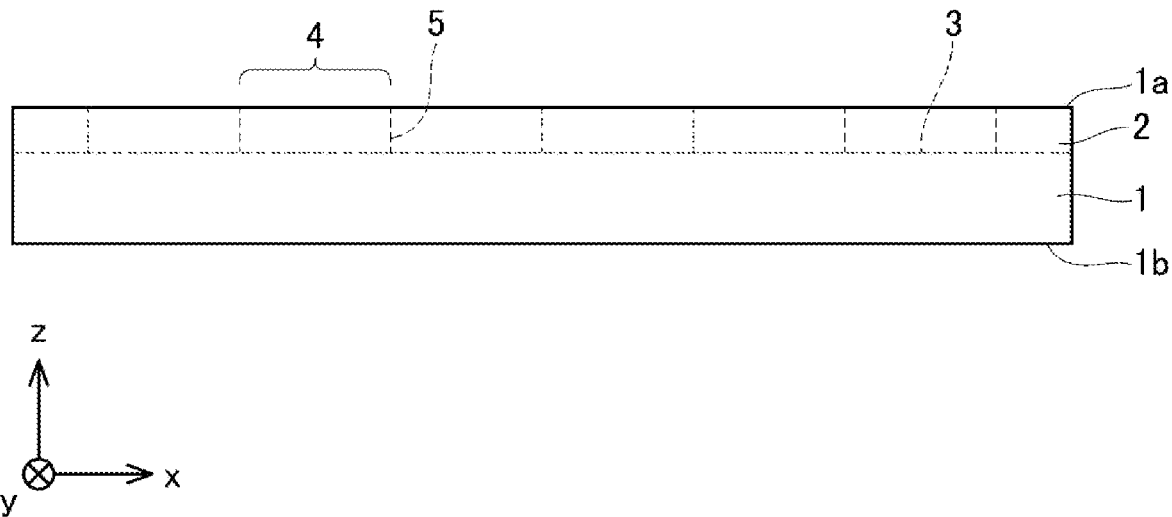
FIG. 2 is a cross-sectional view schematically showing a semiconductor substrate in a manufacturing process of the semiconductor device, taken along a line II-II of FIG. 3, according to the embodiment.

As shown in FIG. 2, the semiconductor substrate 1 has an upper surface 1a and a lower surface 1b, each of which is planar. The upper surface 1a and the lower surface 1b extend in parallel with each other. These upper surface 1a and lower surface 1b may also be referred to as a main surface, respectively. Although the semiconductor substrate 1 is not particularly limited, a gallium nitride substrate may be used as an example. A plane surface 3 extending at a predetermined depth of the semiconductor substrate 1 is, as will be described later, a laser-irradiated surface 3 irradiated with a laser, that is, a surface where a plurality of laser focal points are concentrated. In the present disclosure, a portion of the semiconductor substrate 1 above the laser-irradiated surface 3, that is, a portion to be peeled off from the semiconductor substrate 1 is referred to as a device layer 2. In the following description, a direction parallel to the upper surface 1a of the semiconductor substrate 1 is defined as an x direction, a direction parallel to the upper surface 1a of the semiconductor substrate 1 and orthogonal to the x direction is defined as a y direction, and a direction orthogonal to both of the x direction and the y direction is defined as a z direction. The z direction may also be referred to as a thickness direction of the semiconductor substrate 1.

Figure 3:
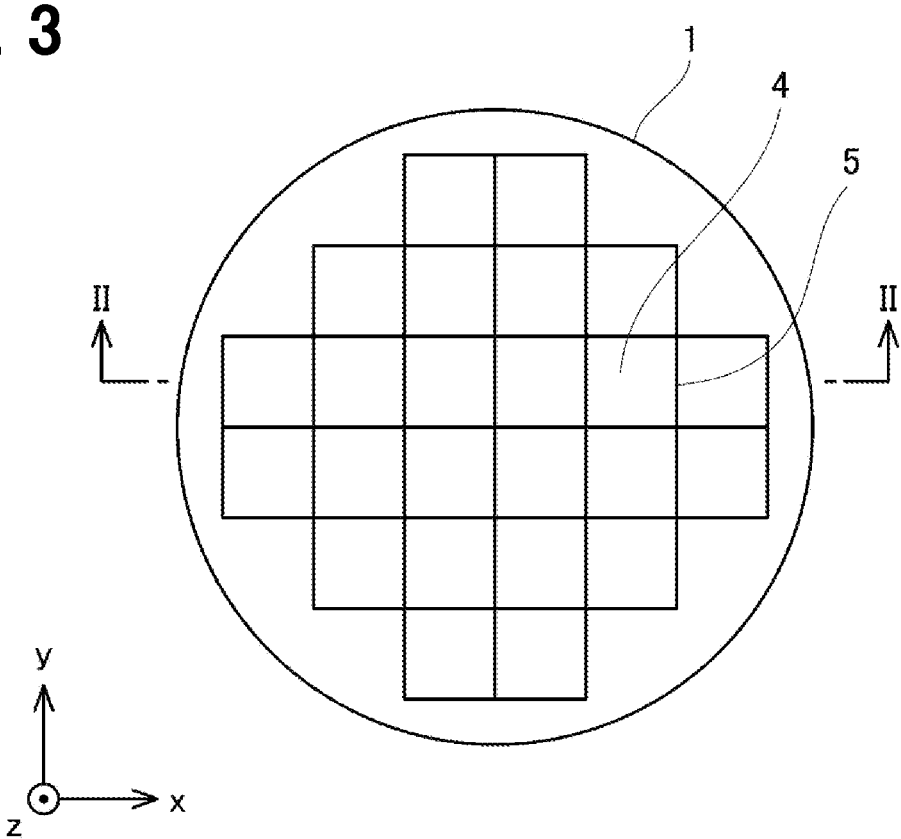
FIG. 3 is a top view schematically showing an arrangement of a device region of the semiconductor substrate, according to the embodiment.

As shown in FIGS. 2 and 3, the device layer 2 of the semiconductor substrate 1 is provided with a plurality of device regions 4 partitioned by dicing lines 5. A device structure is formed in each of the plurality of device regions 4. Although the device structure is not particularly limited, it is, for example, a switching element structure. Specifically, the switching element structure includes an element region arranged on a center area side of the device region 4 and an end region disposed around the element region when being viewed from a direction orthogonal to the upper surface 1a of the semiconductor substrate 1, that is, when the semiconductor substrate 1 is viewed from the above. The element region is a region in which an insulated gate is arranged and a region through which an electric current flows. The end region is a region where a high breakdown voltage structure (e.g., a guard-ring structure or a RESURF layer) is arranged. Examples of such switching element structures include MOSFETs (Metal Oxide Semiconductor Field Effect Transistors) and IGBTs (Insulated Gate Bipolar Transistors).

Figure 4:
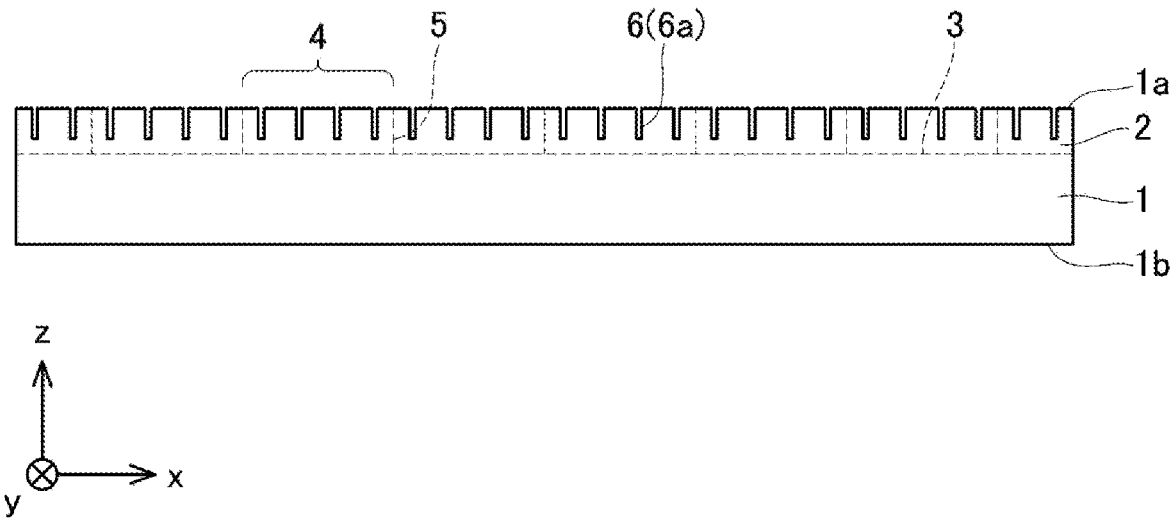
FIG. 4 is a cross-sectional view schematically showing the semiconductor substrate in the manufacturing process of the semiconductor device, taken along a line IV-IV of FIG. 5, according to the embodiment.
Figure 5:
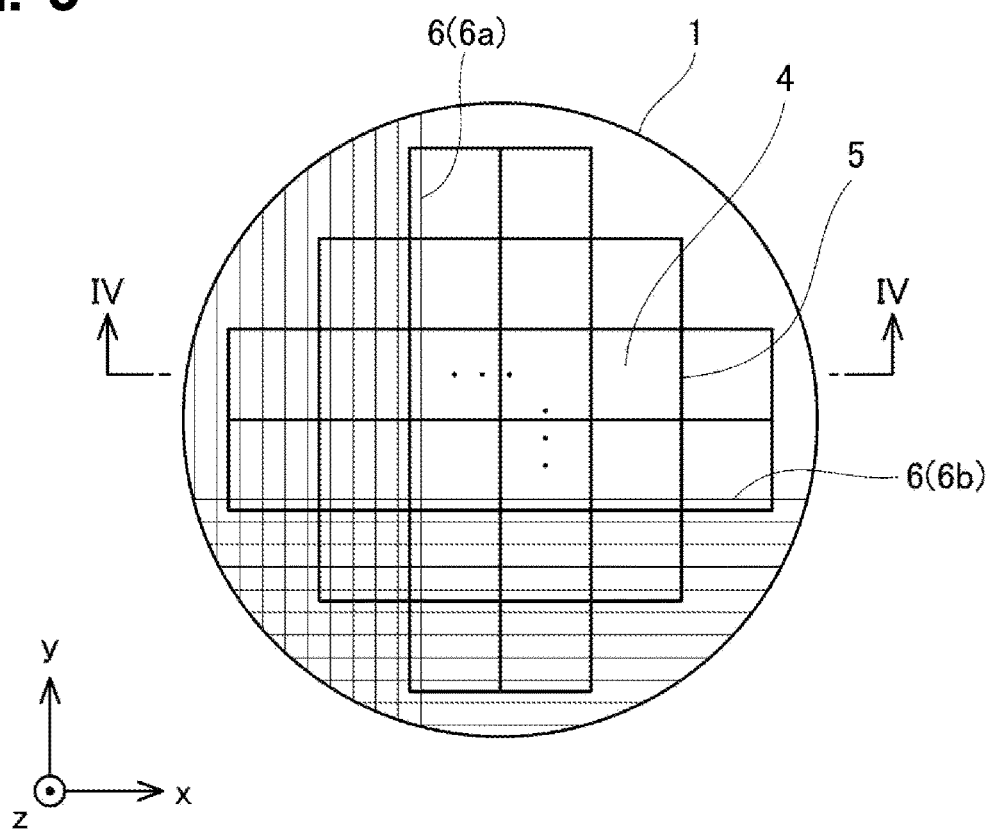
FIG. 5 is a top view schematically showing an arrangement of trenches on the semiconductor substrate, according to the embodiment.

As shown in FIGS. 4 and 5, in the trench forming step (step S1 in FIG. 1), trenches 6 are formed on the upper surface 1*a* of the semiconductor substrate 1 to extend a predetermined dimension from the upper surface 1*a* using a dry etching technique. In such example, the trenches 6 include a plurality of first trenches 6*a* extending along the y direction and arranged in the x direction, and a plurality of second trenches 6*b* extending along the x direction and arranging in the y direction. Each of the plurality of first trenches 6*a* extends from one end surface of the semiconductor substrate 1 to the other end surface in the y direction, and is arranged at regular intervals in the x direction. Each of the plurality of second trenches 6*b* extends from one end surface of the semiconductor substrate 1 to the other end surface in the x direction, and is arranged at regular intervals in the y direction. In addition, in FIG. 5, for the purpose of clarifying the drawing, only a part of the plurality of first trenches 6*a* and the plurality of second trenches 6*b* are illustrated.

A portion of the plurality of first trenches 6*a* extends across the plurality of device regions 4, and extends within the element region of the device structure formed in the device region 4. Similarly, a portion of the plurality of second trenches 6*b* also extends across the plurality of device regions 4 and extends within the element region of the device structure formed in the device region 4. Such an arrangement of the first trenches 6*a* and the second trenches 6*b* reduces the area of the element region of the device structure, thereby lowering the maximum current that the device structure can carry. Therefore, the arrangement of the first trenches 6*a* and the second trenches 6*b* is appropriately set in consideration of both stress relaxation and electrical characteristics of the device structure, which will be described later.

Before the trench forming step, the semiconductor substrate 1 is often warped such that the lower surface 1*b* becomes convex due to thermal stress applied during the processes such as crystal growth and annealing. By performing the trench forming step, the thermal stress of the semiconductor substrate 1 is reduced and the warpage of the semiconductor substrate 1 is reduced. After the trench forming step, the step of forming the device structure is performed.

Figure 6:
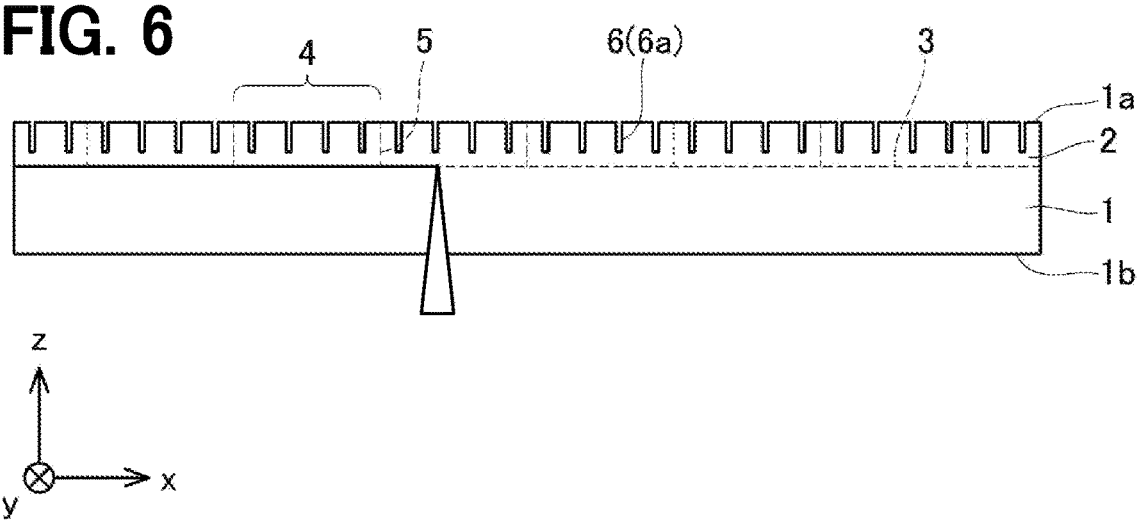
FIG. 6 is a cross-sectional view showing the semiconductor substrate in a manufacturing process of the semiconductor device according to the embodiment.

As shown in FIG. 6, in the laser irradiation step (step S2 in FIG. 1), the plane surface 3 of the semiconductor substrate 1 extending at a predetermined depth is irradiated with the laser. The laser is irradiated so as to be collected at a predetermined depth of the semiconductor substrate 1 from the lower surface 1*b* of the semiconductor substrate 1 where the trench 6 is not formed. For example, the laser is a laser with a wavelength range that is transmissive to the semiconductor substrate (e.g., gallium nitride substrate in such example). At the position of the laser light collected point, the crystal forming the semiconductor substrate 1 (in this example, a single crystal of gallium nitride) is heated and decomposed. As a result, an altered layer is formed as a precipitation layer at the position of the laser light collected point as precipitation of composite atoms of the crystal forming the semiconductor substrate 1, e.g., as a precipitation layer of gallium nitride. The strength of the altered layer is lower than that of the crystal forming the semiconductor substrate 1. Therefore, the strength of the altered layer is lower than that of the surrounding crystal in the semiconductor substrate 1.

Figure 7:
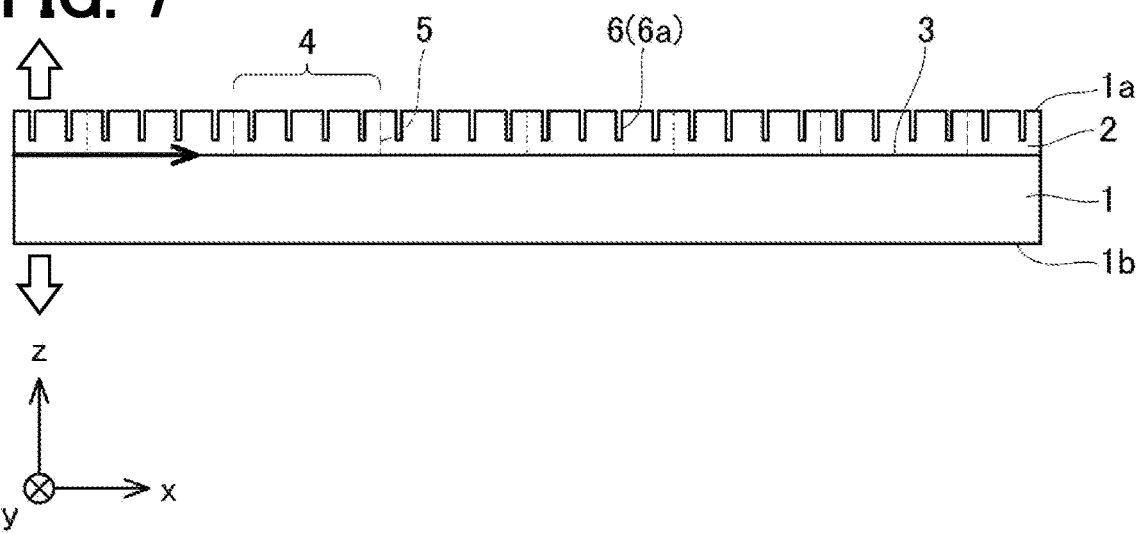
FIG. 7 is a cross-sectional view of the semiconductor substrate in a manufacturing process of the semiconductor device according to the embodiment.

As shown in FIG. 7, in the peeling step (step S3 in FIG. 1), the device layer 2 having the device structure is peeled off from the semiconductor substrate 1 along the plane surface 3 irradiated with the laser. Specifically, an adhesive sheet is attached to each of the upper surface 1*a* and the lower surface 1*b* of the semiconductor substrate 1, and the device layer 2 is peeled off from the semiconductor substrate 1 by pulling the adhesive sheets. In this example, the device layer 2 is peeled off from one end of the semiconductor substrate 1 in the x direction (i.e., a left end in FIG. 7) toward the other end (i.e., a right end in FIG. 7). In this peeling step, the trenches 6 formed in the trench forming step remain unfilled. In this case, since a state in which the warpage of the semiconductor substrate 1 is suppressible is maintained, the altered layer formed by the laser irradiation extends in the same plane within the semiconductor substrate 1. As a result, when the device layer 2 is peeled off from the semiconductor substrate 1, the peeling force can be transmitted appropriately along the altered layer as indicated by an arrow in FIG. 7, so that the device layer 2 can be appropriately peeled off from the semiconductor substrate 1.

As described above, in this peeling step, the device layer 2 is peeled off from the semiconductor substrate 1 from one end of the semiconductor substrate 1 toward the other end in the x direction. The warpage of the semiconductor substrate 1 is appropriately reduced in the direction in which the pitch of the trenches 6 is narrow and the trenches 6 appear repeatedly. In the semiconductor substrate 1, the x direction is a direction in which the pitch of the trenches 6 is the smallest, and the warpage in the x direction is appropriately reduced. In this peeling step, since the device layer 2 is peeled off from the semiconductor substrate 1 along the x direction, the peeling force can be appropriately transmitted along the altered layer. For the same reason, in the peeling step, the device layer 2 may be peeled off from the semiconductor substrate 1, from one end of the semiconductor substrate 1 toward the other end in the y direction.

In the peeling step of such example, the trenches 6 formed in the trench forming step are left unfilled. Alternatively, the trenches 6 may be filled with a material having a lower coefficient of thermal expansion than the material of the semiconductor substrate 1 (i.e., a gallium nitride substrate in this example). By filling the trenches 6 with a material having a low coefficient of thermal expansion, it is possible to suppress the warpage of the semiconductor substrate 1, and to suppress the generation of foreign matter due to process residues remaining in the trenches 6. Materials with such a low coefficient of thermal expansion are not particularly limited, but may be, for example, silicon oxide (SiO2) or silicon nitride (SiN). When these insulating materials are used, they can also be used as a part of the high breakdown voltage structure in the termination region of the device structure.

The semiconductor substrate 1 from which the device layer 2 has been peeled off is reused for manufacturing semiconductor devices. For example, after polishing and etching the peeled surface of the semiconductor substrate 1, an epitaxial layer is formed on the peeled surface using an epitaxial crystal growth technique, thereby enabling a formation of a device structure on such an epitaxial layer.

Figure 8:
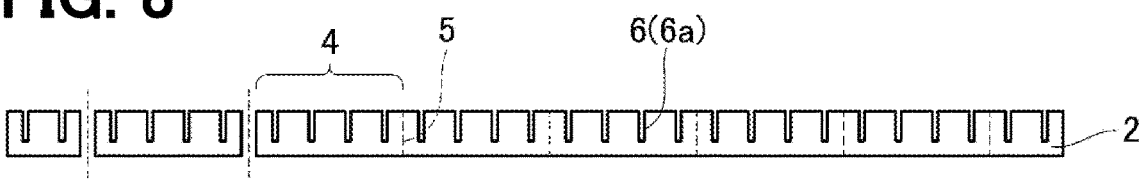
FIG. 8 is a cross-sectional view of a device layer peeled off from the semiconductor substrate in a manufacturing process of the semiconductor device according to the embodiment.
Figure 8:
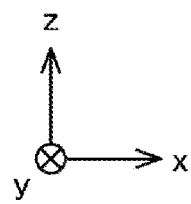

As shown in FIG. 8, in the dicing step (step S4 in FIG. 1), after performing a polishing process, an electrode formation process and the like on the device layer 2 peeled off from the semiconductor substrate 1, a plurality of devices (i.e., which may also be called as dies) are cut out to complete a semiconductor device.

Figure 9:
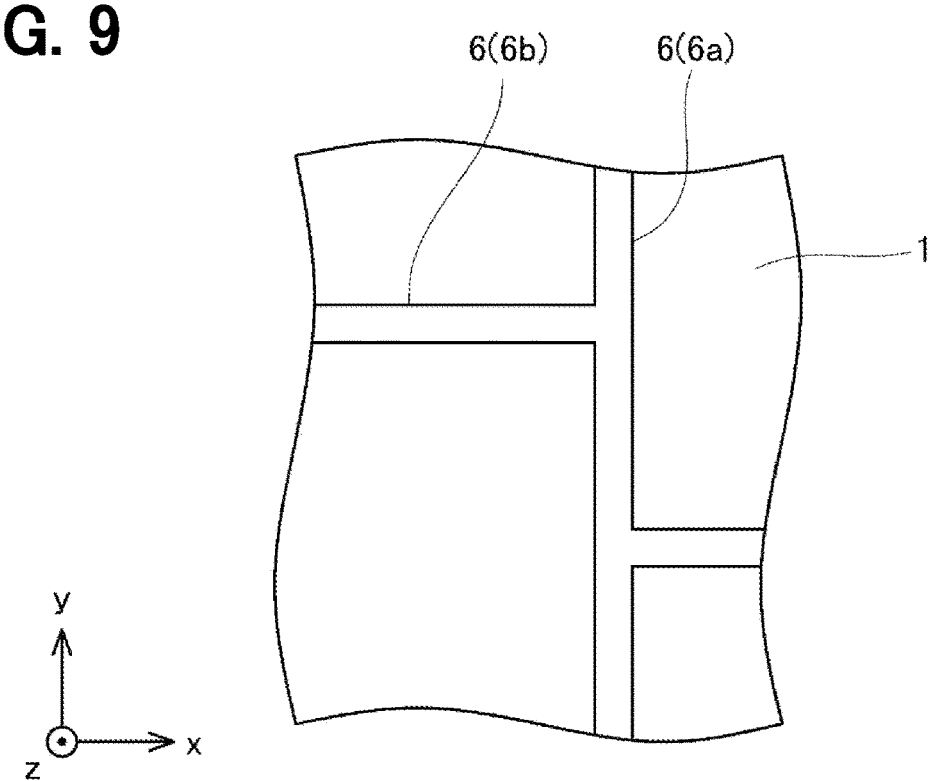
FIG. 9 is an enlarged view schematically showing an arrangement of trenches of a semiconductor substrate according to a modified embodiment of the present disclosure.

In the above embodiment, when the semiconductor substrate 1 is viewed from a side of the upper surface 1a, the first trench 6a and the second trench 6b are arranged so as to cross each other. Instead of such an arrangement, as shown in a modification of FIG. 9, when the semiconductor substrate 1 is viewed from the above, the first trench 6a and the second trench 6b may be connected in a planar T-shape. Compared to a case where the trenches cross each other in the above embodiment, the stress at the connecting portion between the first trench 6a and the second trench 6b is reduced, and damage to the semiconductor substrate 1 is reduced.

Figure 10:
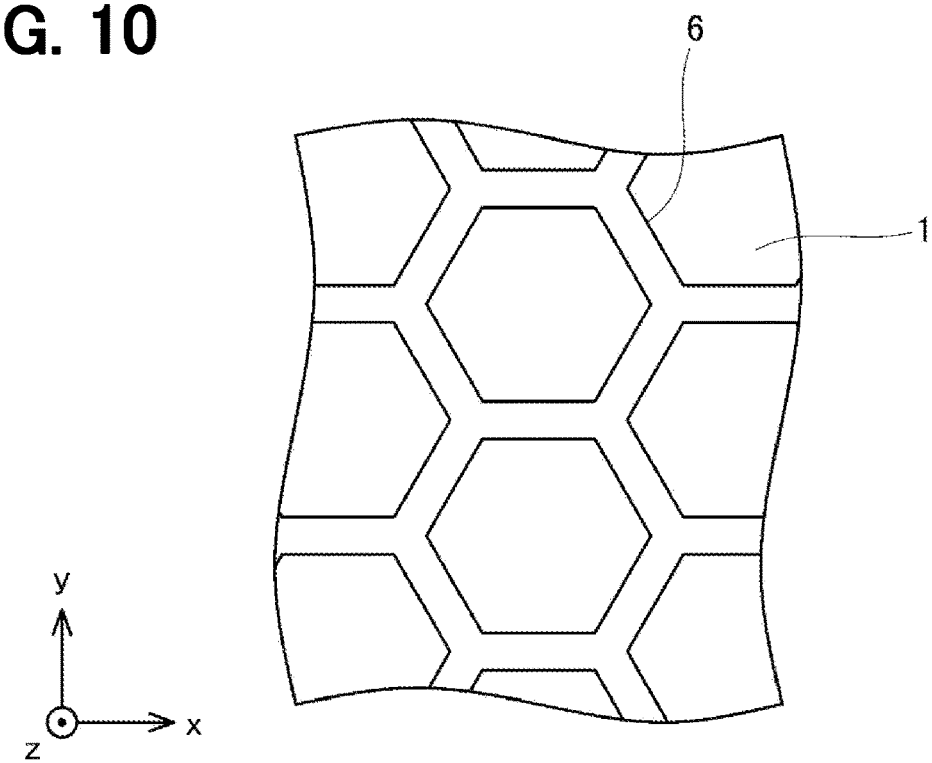
FIG. 10 is an enlarged view schematically showing an arrangement of trenches of a semiconductor substrate according to an another modified embodiment of the present disclosure.

Further, as in a modification shown in FIG. 10, when the semiconductor substrate 1 is viewed from the above, the trenches 6 may extend like hexagons arranged without gaps. Furthermore, the trenches 6 may extend to form a honeycomb structure in which regular hexagons are arranged without gaps. In such example, the semiconductor substrate 1 is a hexagonal crystal gallium nitride substrate, and the thickness direction (z-axis) of the semiconductor substrate 1 is the c-axis. Further, each side of the hexagon extends parallel to an m-plane, a-plane, or any other arbitrary plane. In this modification, when the semiconductor substrate 1 is viewed from the above, the trenches 6 are formed so as to appear repeatedly along three directions by an angle of 120°, so that the warpage of the semiconductor substrate 1 is well balanced as a whole. Further, since the angle between the trenches 6 at the portion where the trenches 6 are connected becomes an obtuse angle, the stress at that portion is reduced, and damage to the semiconductor substrate 1 is suppressible.

Further, in the above-described embodiments and modifications, the trenches 6 extend continuously without interruption on the upper surface of the semiconductor substrate 1. Instead of such examples, or in addition to those examples, the trenches may be distributed. For example, when the semiconductor substrate 1 is viewed from the above, a trench may be formed that makes a circuit in the device region 4, or a trench that makes a circuit around the device region 4 along the dicing line 5 may be formed.

The cross-sectional shape of the trench 6 is not particularly limited. For example, a bottom surface may have a convex curved surface toward a downward direction. In the trench 6 having such a cross-sectional shape, the stress applied to the bottom of the trench 6 is reduced, and damage to the semiconductor substrate 1 is suppressible.

Also, the depth of the trench 6 is not particularly limited, but may be deeper than the epitaxial layer. One of the causes of warpage of the semiconductor substrate 1 is considered to be stress (i.e., mainly tensile stress) applied to the epitaxial layer during crystal growth of the epitaxial layer. Therefore, by forming the trench 6 deeper than the epitaxial layer, warpage of the semiconductor substrate 1 is effectively reduced.

(Regarding Trench Pitch)

A peeling test was performed on the semiconductor substrate 1 of the above example under the following conditions.

Diameter of the semiconductor substrate 1: 50 mm
Thickness of the semiconductor substrate 1: 0.4 mm
Width of the first trench 6a: 10 μm
Depth of the first trench 6a: 10 μm
Pitch of the first trench 6a: 1 mm
Width of the second trench 6b: 10 μm
Depth of the second trench 6b: 10 μm
Pitch of the second trench 6b: 1 mm As a result of the peeling test, it was confirmed that the probability of appropriate peeling (i.e., the peeling success rate) was greatly improved compared to the case where no trench was formed. Specifically, the peeling success rate of the example without trenches was 25%, while the peeling success rate of the example with trenches was 75%. In wafer dimensions corresponding to the SEMI standard shown below, the pitch of the trenches for obtaining the same load distribution as in the peeling test was calculated using a simple beam uniformly distributed load equation, and the results are plotted in FIG. 11. The x-axis is the diameter of the semiconductor substrate and the y-axis is the trench pitch.

TABLE 1

| | | | | | |
|---|---|---|---|---|---|
| Diameter of semiconductor substrate (mm) | 50 | 100 | 150 | 200 | 300 |
| Thickness of semiconductor substrate (mm) | 0.4 | 0.525 | 0.625 | 0.725 | 0.775 |

Figure 11:
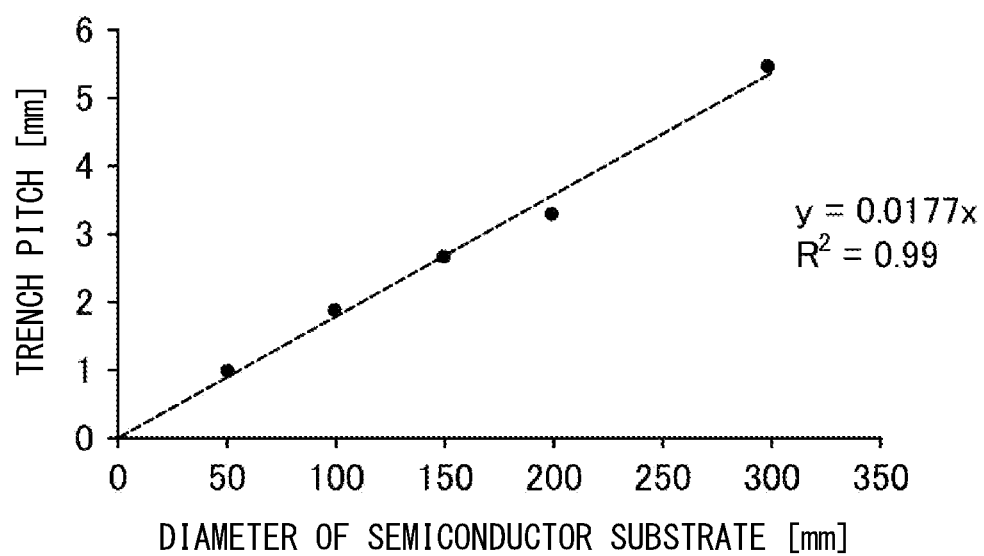
FIG. 11 is a diagram showing a relationship between a diameter of the semiconductor substrate and trench pitch according to the present disclosure.

The regression line in FIG. 11 suggests that, when the pitch of the trenches 6 is 0.0177 times of the diameter of the semiconductor substrate 1, a peeling success rate equivalent to that of the peeling test can be obtained. From such a result, in the trenches formed to repeatedly appear along at least one direction on one main surface, when the maximum pitch of the trenches measured along the at least one direction is equal to or less than 0.0177 times of the diameter of the semiconductor substrate, a peeling success rate equal to or higher than that of the above peeling test can be obtained.

For example, a method of manufacturing a semiconductor device including: forming a plurality of trenches on a first main surface of a semiconductor substrate with a device structure; irradiating a laser from a second main surface of the semiconductor substrate to a predetermined inside surface that is positioned and extends at a predetermined depth of the semiconductor substrate; and peeling a device layer off from the semiconductor substrate along the predetermined inside surface on which the laser is irradiated. The peeling is performed in a state in which the trenches are formed on the first main surface of the semiconductor substrate. The peeling step may be performed in a state in which the trenches are unfilled or filled with a material having a coefficient of thermal expansion lower than that of the semiconductor substrate. In the present disclosure, the other steps and process may be suitably changed in accordance with a condition.

Although the embodiments have been described in detail above, these are merely examples and do not limit the scope of the present disclosure. The techniques described in the present disclosure include various changes and modifications of the specific examples illustrated above. The technical elements described in the present specification or in the drawings exhibit technical usefulness individually or in various combinations, which are not limited only to the combinations described above. In addition, the techniques illustrated in the present specification or drawings achieve multiple objectives at the same time, or achieve at least one of the multiple objectives.

What is claimed is:

1. A method of manufacturing a semiconductor device, comprising:
a trench forming step forming a plurality of trenches in a first main surface of a semiconductor substrate that has a second main surface in addition to the first main surface, a device structure being formed on the first main surface of the semiconductor substrate;

a laser irradiation step irradiating a laser to a plane surface that is positioned and extends at a predetermined depth of the semiconductor substrate, the laser being irradiated to the plane surface from the second main surface; and a peeling step peeling a device layer off from the semiconductor substrate along the plane surface on which the laser is irradiated, wherein the peeling step is performed in a state in which the trenches remain unfilled or are filled with a solid material having a coefficient of thermal expansion lower than that of the semiconductor substrate, the device layer is partitioned by dicing lines into a plurality of device regions, the device structure is formed respectively in each of the plurality of device regions, and each trench of the plurality of trenches, in an area where the plurality of device regions are formed, continuously extends across at least two of the plurality of device regions.

2. The method of manufacturing a semiconductor device of claim 1, wherein in the trench forming step, the trenches are formed to appear repeatedly along at least one direction on the first main surface.

3. The method of manufacturing a semiconductor device of claim 2, wherein in the peeling step, the device layer is peeled off from the semiconductor substrate from one end portion toward an other end portion of the semiconductor substrate in the at least one direction.

4. The method of manufacturing a semiconductor device of claim 1, wherein the trenches are arranged at regular intervals along at least one direction on the first main surface.

5. The method of manufacturing a semiconductor device of claim 1, further comprising a dicing step dicing the plurality of device regions along dicing lines, wherein the device structure is formed respectively in each of the plurality of device regions, wherein the dicing step is performed after the peeling step.

6. The method of manufacturing a semiconductor device of claim 1, wherein a pitch of the plurality of trenches is less than a pitch of the dicing lines.

7. The method of manufacturing a semiconductor device of claim 1, wherein the trench forming step is performed through dry etching.

8. The method of manufacturing a semiconductor device of claim 1, wherein the peeling step is performed in a state in which the trenches are unfilled with the solid material having a coefficient of thermal expansion lower than that of the semiconductor substrate.

9. The method of manufacturing a semiconductor device of claim 1, wherein the plurality of regions are adapted to be diced at the dicing lines in the device layer.

10. A method of manufacturing a semiconductor device, comprising:

forming a plurality of trenches in a first main surface of a semiconductor substrate, the first main surface being provided with a device structure;

irradiating a laser to a predetermined inside surface that is positioned and extends at a predetermined depth of the semiconductor substrate, the laser being irradiated to the predetermined inside surface from a second main surface of the semiconductor substrate; and peeling a device layer off from the semiconductor substrate along the predetermined inside surface on which the laser is irradiated, wherein the peeling is performed in a state in which the trenches are formed on the first main surface of the semiconductor substrate, the device layer is partitioned by dicing lines into a plurality of device regions, the device structure is formed respectively in each of the plurality of device regions, and each trench of the plurality of trenches, in an area where the plurality of device regions are formed, continuously extends across at least two of the plurality of device regions.

11. The method of manufacturing a semiconductor device of claim 10, wherein the trenches are formed to be arranged at regular intervals along at least one direction on the first main surface.

* * * * *